United States Patent
Takizawa

(10) Patent No.: US 6,275,057 B1
(45) Date of Patent: Aug. 14, 2001

(54) SEMICONDUCTOR TEST SYSTEM HAVING HIGH FREQUENCY AND LOW JITTER CLOCK GENERATOR

(75) Inventor: Shigeki Takizawa, Meiwa-mura (JP)

(73) Assignee: Advantest Corp, Tokyo (JP)

( * ) Notice: Subject to any disclaimer, the term of this patent is extended or adjusted under 35 U.S.C. 154(b) by 0 days.

(21) Appl. No.: 09/115,661

(22) Filed: Jul. 15, 1998

(30) Foreign Application Priority Data

Jul. 18, 1997 (JP) .................................................... 9-194004

(51) Int. Cl.[7] .................................................. G01R 23/02
(52) U.S. Cl. ........................ 324/765; 324/158.1; 324/755
(58) Field of Search ................................. 324/765, 764, 324/73.1, 158.1, 755; 714/724

(56) References Cited

U.S. PATENT DOCUMENTS 5,295,079 * 3/1994 Wong et al. .................... 324/73.1
5,373,255 * 12/1994 Bray et al. .......................... 331/1 A
5,886,536 * 3/1999 Tsuruki .............................. 324/765

\* cited by examiner

*Primary Examiner*—Glenn W. Brown
*Assistant Examiner*—Jimmy Nguyen
(74) *Attorney, Agent, or Firm*—Muramatsu & Associates

(57) ABSTRACT

A semiconductor test system having a high repetition rate and small jitter clock generator for supplying the clock signal to a device under test (DUT). The semiconductor test system includes a clock generator for generating a reference clock signal, a frame processor for producing a clock signal of predetermined waveform based on the reference clock signal from the clock generator, a phase lock loop (PLL) circuit for generating a clock signal based on the clock signal from the frame processor where the frequency generated by the PLL circuit is higher than that of the clock signal from the frame processor, and a driver for directly receiving the clock signal from the PLL circuit to apply the clock signal to the DUT with a predetermined amplitude.

13 Claims, 5 Drawing Sheets

Fig.2
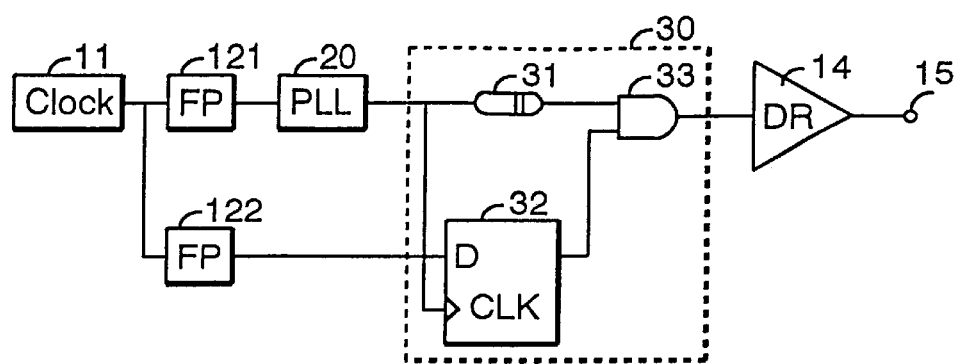
Fig. 3A : 121 OUT
Fig. 3B : 20 OUT
Fig. 3C : 122 OUT
Fig. 3D : 31 OUT
Fig. 3E : 32 OUT
Fig. 3F : 14 OUT
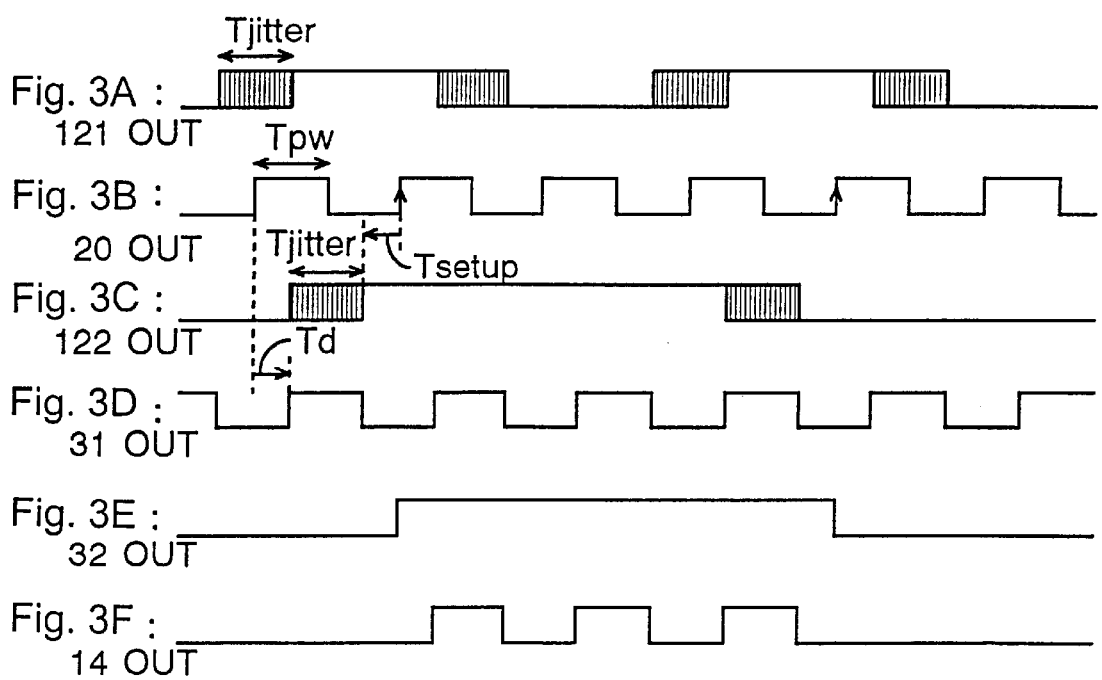

US 6,275,057 B1

SEMICONDUCTOR TEST SYSTEM HAVING HIGH FREQUENCY AND LOW JITTER CLOCK GENERATOR

FIELD OF THE INVENTION

This invention relates to a semiconductor test system having a high repetition rate and small jitter clock generator, and more particularly, to a semiconductor test system which is able to apply high frequency and low jitter clock signals to an IC device to evaluate the performance of the IC device.

BACKGROUND OF THE INVENTION

In testing a semiconductor IC device, a semiconductor test system applies a test pattern signal to a device under test (DUT) and the resultant output signal of the DUT is compared with an expected value signal. An example of basic structure of a semiconductor test system is shown in FIG. 4. Based on a test program, a test processor (TP) 1 controls an overall operation of the test system by sending control signals to each unit of the test system through a tester bus. A pattern generator (PG) 2 generates a test pattern to be supplied to a device under test (DUT) 9 and an expected data pattern to be supplied to a logic comparator 7. A timing generator (TG) 3 generates timing pulses to be supplied to a wave formatter (WF) 4, the logic comparator and other functional blocks to synchronize various timings in the test system.

The test pattern from the pattern generator 2 is formed to a specified waveform such as an RZ (return to zero), NRZ (non-return to zero), or EOR (exclusive OR) waveform by the wave formatter 4. The test pattern from the wave formatter 4 is then applied to the DUT 9 through a driver 5 which defined an amplitude and slew rate of the test pattern. An output signal of the DUT 9 produced in response to the test pattern is provided to the logic comparator 7 through an analog comparator 6. The logic comparator 7 compares the output signal with the expected data pattern from the pattern generator 2. If the output signal mismatches the expected data, the test system determines that the DUT 9 has failed in the test. The fail information is stored in a fail memory (FM) 8 in the test system along with other information, such as address data, from the pattern generator 2 to be used in a failure analysis process following the test.

Semiconductor IC devices are ever increasing in the density, speed and functionality. Some of the recent LSI (large scale integrated circuit) circuits include many complicated sequential circuits which form combinational circuits and memory circuits therein. One of the methods of testing such a complicated LSI circuit is an LSSD (Level Sensitive Scan Design) having a scan architecture in which memory elements in the LSI circuit are accessed through shift register stages. In this architecture, a large number of memory elements can be tested through a small number of external pins by scanning the series connected shift register stages. To fully evaluate such an LSI circuit, a semiconductor test system must provided high frequency and low jitter clock signals to the LSI circuit under test.

An architecture of semiconductor test system is also changing with the development of LSI devices to be tested. Traditionally, an architecture called a shared resource tester is widely used, while modernly, an architecture called a per-pin tester is developed for a more complicated and large scale LSI circuit. Here, the shared resource tester is a tester architecture which includes a plurality of identical resources such as timing generators, wave formatters, reference voltages, etc. wherein the number of such identical resources is smaller than the number of test pins (channels) of the semiconductor test system. Thus, the common resources must be shared among the test pins.

The per-pin tester, on the other hand, includes the same number of identical resources as the number of test pins so that test parameters in each test pin can be set independently from the other test pins. Although requiring more expensive and larger size hardware, the per-pin tester is suitable for testing a complicated LSI circuit, since test patterns and timings can be more freely produced than the shared resource tester.

In the per-pin tester, a frame processor is provided in each test pin. The frame processor performs the functions of the timing generator 3, wave formatter 4 and logic comparator 7 in the conventional shared resource tester of FIG. 4. The frame processor produces a test waveform which is formed of a plurality of single frames. Usually, a time length of a single frame is the same as a time period of a reference clock used in the test system.

In a semiconductor test system, the maximum operational speed of inner circuits and components is designed to accommodate the frequency of a reference clock so that all of the test system can be synchronized with the reference clock. For example, when the reference clock frequency is 100 MHz, the maximum operational speed of the frame processor must be greater than 100 MHz. In the case where the frequency of the reference clock is 200 MHz, the frame processor or other circuits must be able to operate at 200 MHz or higher. The reference clock must also be provided to an LSI device under test as test signals.

Because of the increase in the operational speed of the recent semiconductor devices, a semiconductor tester is not always able to meet the requirements of generating the maximum clock speed. For example, some of the most recent LSI devices require reference clock frequencies of 1,200 MHz to be fully tested, which is usually not possible for a large semiconductor test system. To overcome this problem, a semiconductor test system employs an interleave method in which a plurality of lower speed circuits are provided in a parallel fashion and interleaved (multiplexed) in a series fashion to achieve a higher speed operation.

FIG. 5 is a block diagram showing an example of clock generator for providing a clock signal to an LSI device under test by means of the interleave method. A reference clock generator 11 provides a clock signal to a plurality of frame processors $12_1$–$12_n$ in a parallel fashion. The outputs of the frame processors $12_1$–$12_n$ are provided to a multiplexer 13 whose output is connected to a driver 14. The driver 14 provides the clock signal to a clock terminal 10 of the device under test 9 through a test pin 15.

The clock signals from the frame processors $12_1$–$12_n$ are phase-shifted and sequentially combined by the multiplexer 13 to produce a series clock signal. Thus, the overall repetition rate of the clock signal at the output of the multiplexer 13 is multiplied by the number of frame processors incorporated. For example, when the reference clock frequency is 100 MHz, and two frame processors $12_1$ and $12_2$ are used in parallel, the reference clock of one frame processor is delayed by 5 ns (nanosecond) from the other. Then, the two clock signals are combined into a series clock signal, which results in 200 MHz in frequency. By increasing the number of frame processors 12, a higher frequency of the clock signal can be obtained accordingly.

However, as shown in FIG. 6, the clock signal generated by the reference clock generator 11 includes jitter or fluctuations. Such jitter remains the same when the plurality of clock signals are multiplexed and combined into a high frequency clock signal in the interleave method. Thus, the ratio of jitter versus time period of the clock signal increases with the increase of the clock signal frequency, which makes it impossible to test a semiconductor device with high timing resolution.

SUMMARY OF THE INVENTION

Therefore, it is an object of the present invention to provide a semiconductor test system having a clock generator which is able to apply high frequency and low jitter clock signals to an IC device under test to evaluate the performance thereof.

It is another object of the present invention to provide a semiconductor test system which is capable of generating a specified number of clock pulses with low jitter to a semiconductor device to be tested.

It is a further object of the present invention to provide means for generating high frequency and low jitter clock signals which is applicable to both a per-pin type tester and a shared resource type tester.

In the present invention, a semiconductor test system includes a phase lock loop circuit for multiplying the frequency of a clock signal as well as reducing the jitter involved in the clock signal.

The semiconductor test system of the present invention is comprised of a clock generator for generating a reference clock signal, a frame processor for producing a clock signal of predetermined waveform based on the reference clock signal from the clock generator, a phase lock loop (PLL) circuit for generating a high frequency clock signal based on the clock signal from the frame processor, and a driver for applying the clock signal from the PLL circuit to the DUT with a predetermined amplitude.

The PLL circuit is formed of a phase comparator for comparing phases of two input signals and producing an output voltage representing the phase difference between the two input signals, a loop filter for transmitting a low frequency component of the output voltage of the phase comparator in order to regulate a frequency response of the phase lock loop, and a voltage controlled oscillator (VCO) whose oscillation frequency is controlled by the voltage from the loop filter. The PLL circuit may further includes a counter for reducing the frequency of the clock signal from the frame processor by a predetermined division ratio, and a pre-scaler for dividing the oscillation frequency of the VCO by a predetermined division ratio. For freely changing the oscillation frequency, the PLL circuit may further include a programmable counter for dividing the oscillation frequency of the VCO by a variable division ratio, and a latch for receiving the data indicating the variable division ratio to be set in the programmable counter.

In another aspect of the present invention, the semiconductor test system includes a clock generator for generating a reference clock signal, a first frame processor for producing a clock signal of predetermined waveform based on the reference clock signal from the clock generator, a phase lock loop (PLL) circuit for generating a high frequency clock signal based on the clock signal from the first frame processor, a second frame processor for producing a gate signal whose time interval represents a specified number of clock pulses to be applied to the DUT, an output control circuit for generating the specified number of pulses of the clock signal from the PLL circuit based on the gate signal from the second frame processor, and a driver for applying the specified number of clock pulses from the output control circuit to the DUT with a predetermined amplitude.

The present invention is applicable to a shared resource type semiconductor test system. The test system includes a test processor for controlling an overall operation of the semiconductor test system, a pattern generator for generating a test pattern signal and an expected value signal based on the instructions from the test processor, a timing generator for generating timing signals for defining timings in the semiconductor test system, a wave formatter for producing wave forms of the test pattern signal to be applied to the DUT based on the test pattern from the pattern generator and the timing signal from the timing generator, a phase lock loop (PLL) circuit for generating a high frequency clock signal based on the wave-formatted test pattern signal from the wave formatter, and a driver for applying the high frequency clock signal from the PLL circuit to the DUT with a predetermined amplitude.

According to the present invention, the semiconductor test system is able to apply high frequency and low jitter clock signals to an IC device to fully evaluate the performance of the IC device. Further, the semiconductor test system of the present invention is capable of generating a specified number of clock pulses with low jitter to be supplied to an IC device to be tested. The present invention is applicable to both a per-pin type tester and a shared resource type tester.

BRIEF DESCRIPTION OF THE DRAWINGS

FIG. 2 is a block diagram showing another embodiment of semiconductor test system of the present invention.

FIGS. 3A–3F are timing charts showing an operation and waveforms in the embodiment of FIG. 2.

DETAILED DESCRIPTION OF THE PREFERRED EMBODIMENT

Figure 1:
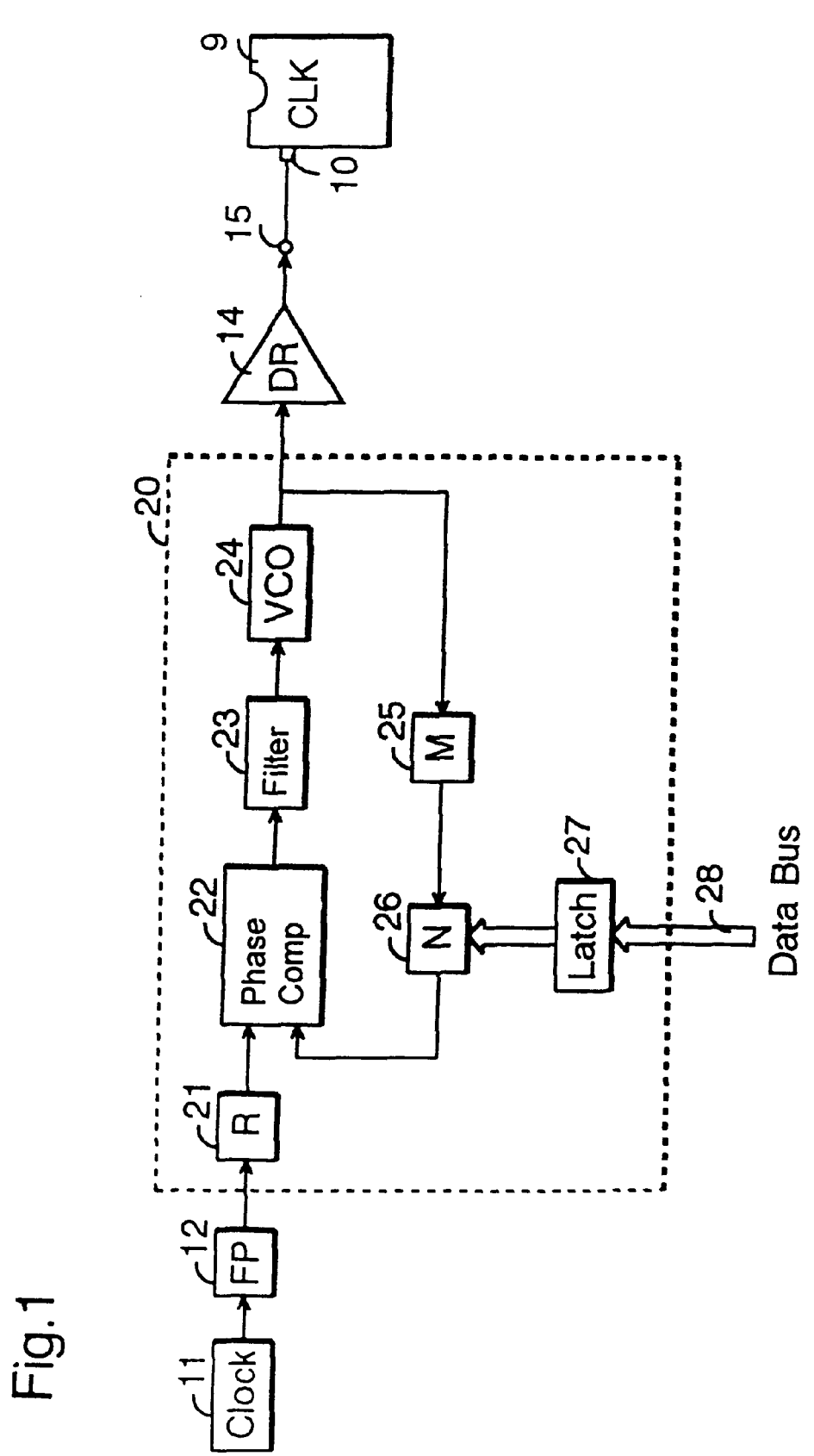
FIG. 1 is a block diagram showing an embodiment of semiconductor test system of the present invention.
Figure 4:
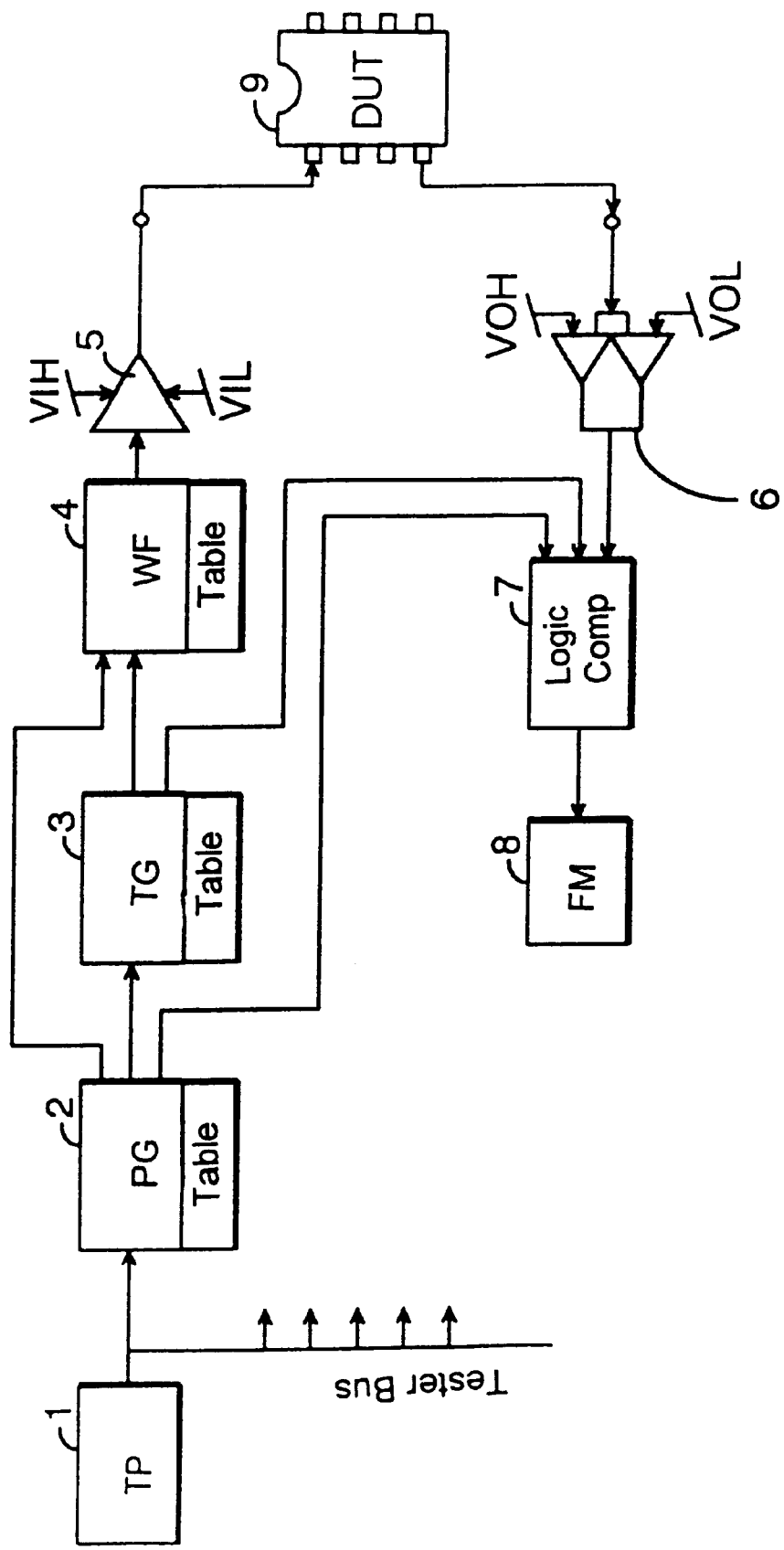
FIG. 4 is block diagram showing an example of basic configuration of the conventional semiconductor test system.
Figure 5:
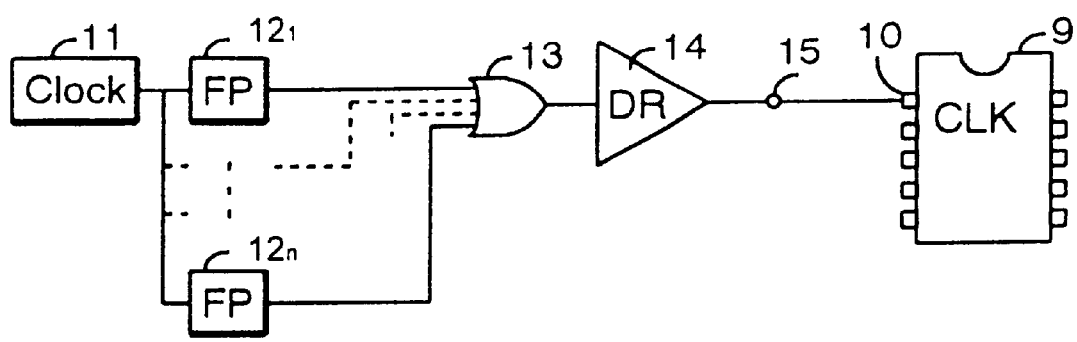
FIG. 5 is a block diagram showing a basic configuration of clock generator using an interleave method.

The first embodiment of the present invention will be described with reference to a block diagram of FIG. 1. Similar to the example of FIG. 5, a reference clock generator 11 provides a clock signal to a frame processor (FP) 12. The output of the frame processor 12 is provided to a driver 14. The driver 15 provides the clock signal with a predetermined amplitude and slew rate to a clock terminal 10 of the device under test (DUT) 9 through a test pin 14. In this example, a phase lock loop 20 is provided between the frame processor 12 and the driver 14.

Figure 6:
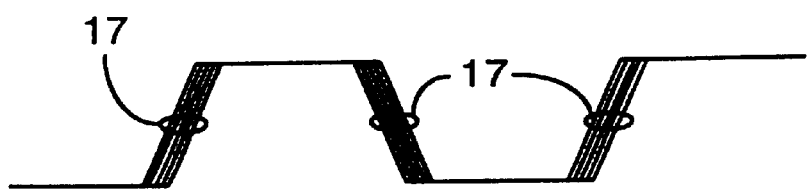
FIG. 6 is a schematic diagram showing a waveform of clock signal having jitter.

The reference clock generated by the clock generator 11 is wave-formatted by the frame processor 12. The clock signal wave shaped by the frame processor 12 includes jitter as shown in FIG. 6. As an example, the frequency of the reference clock is 100 MHz and the frequency of the clock signal to be applied to the DUT 9 is 800 MHz. The phase lock loop (PLL) 20 multiplies the incoming clock signal by eight times while decreasing the jitter. The high frequency and low jitter clock signal is thus produced by the PLL 20 which is supplied to the DUT 9 through the driver 14.

The PLL 20 includes a counter 21 for reducing the frequency of the clock signal from the frame processor 12 by a division ratio R, a phase comparator 22 for comparing the phases of two input signals and producing an output voltage representing the phase difference between the two, a loop filter 23 for transmitting a low frequency component of the output voltage of the phase comparator 22 in order to regulate a frequency response of the phase lock loop, a voltage controlled oscillator (VCO) 24 whose oscillation frequency is controlled by the voltage from the loop filter 23, and a pre-scaler 25 which divides the oscillation frequency of the VCO 24 by a division ratio M. The divided oscillation frequency is returned (feed-backed) to the phase comparator 22 to be compared with the output of the counter 21. As is well known in the art, by the negative feedback loop in the PLL 20, the oscillation frequency of the VCO 24 is controlled in such a way that the phases of the two inputs to the phase comparator 22 be identical.

In this arrangement, when the input frequency $F_{in}$ of the PLL 20 from the frame processor 12, the oscillation frequency $F_{out}$ of the VCO 24 will be $F_{out}=(M/R)F_{in}$. In this case, the output frequency of the PLL 20 is a multiple of the input frequency by a fixed ratio. To generate the output frequency compatible to various frequencies of different devices to be tested, the PLL 20 of FIG. 1 may further include a programmable counter 26 which functions as a variable divider. To set a division ratio N in the programmable counter 26, a latch 27 is provided which receives the data indicating the division ratio N through a data bus 28. Consequently, under this setting, the oscillation frequency $F_{out}$ of the VCO 24 will be $F_{out}=(N\times M/R)F_{in}$ wherein N can be freely set in the PLL 20.

In the present invention, because the negative feedback loop, the PLL 20 controls the output frequency of the VCO 24 to be a multiple or any proportional relationship of the input frequency from the frame processor 12. In addition, because the loop response of the PLL 20, which typically represents a first order delay response curve defined by the filter 23, the jitter in the input clock is dramatically reduced in the output clock. Therefore, a high frequency and low jitter clock signal can be generated by the clock generator of the semiconductor test system.

The second embodiment of the present invention is explained with reference to FIGS. 2 and 3. FIG. 2 is a block diagram showing a structure of the second embodiment and FIGS. 3A–3F are timing charts showing an operation of the second embodiment of FIG. 2. The clock generator of the second embodiment is to generate a predetermined number of clock pulses of low jitter to be supplied to the semiconductor device under test. Such a clock signal with low jitter and predetermined number of pulses is desired in a certain type of test such as a scan test of LSI devices designed by the LSSD scheme noted above.

In the example of FIG. 2, a synchronized output control circuit 30 is provided between the phase lock loop (PLL) 20 and the driver 14. The PLL 20 receives the wave-formatted clock signal from the first frame processor 12₁ so that the clock signal of higher frequency and low jitter is generated by the PLL 20 as described with reference to FIG. 1. The second frame processor 12₂ is provided between the clock generator 11 and the synchronized output control circuit 30. Inputs of the first and second frame processors 12₁ and 12₂ are commonly connected to the clock generator 11 to receive the same clock signal.

The synchronized output control circuit 30 includes a delay element 31, a flip-flop 32 and an AND gate 33. The clock signal from the PLL 20 is provided to both the delay element 31 and the flip-flop 32. The outputs of the delay element 31 and the flip-flop 32 are connected to corresponding inputs of the AND gate 33. The output of the second frame processor 12₂ is connected to the data input D of the flip-flop 32.

The clock signal from the frame processor 12₁ includes jitter as shown in FIG. 3A. In this example, the frequency of the clock signal is increased by three times by the PLL 20 as shown in FIG. 3B. Further, the jitter in the clock signal is reduced at the output of the PLL 20 as described with reference to FIG. 1. The second frame processor 12₂ produces a gate signal of FIG. 3C which defines a time length corresponding to the specified number of clock pulses to be generated by the clock generator. The gate signal includes jitter because it is produced by the clock signal from the clock generator 11.

The gate signal of FIG. 3C is latched by flip-flop 32 at the edges of the clock signal coming after the rising and falling edges of the gate signal as shown in FIGS. 3B and 3E. If the time length of the jitter is smaller than one clock period of the clock signal from the PLL 20, the output of the flip-flop 32 in FIG. 3E reproduces the gate signal without the jitter. The delay element 31 adds a delay time Td to the clock signal from the PLL 20 so that the delayed clock signal comes slightly after the edge of the gate signal from the flip-flop 32. Thus, the specified number of clock pulses are generated by the AND gate 33 as shown in FIG. 3F which is provided to the DUT 14 through the driver 14. The clock pulses of FIG. 3F has the same repetition rate of the clock signal from the PLL 20 with reduced jitter.

Figure 7:
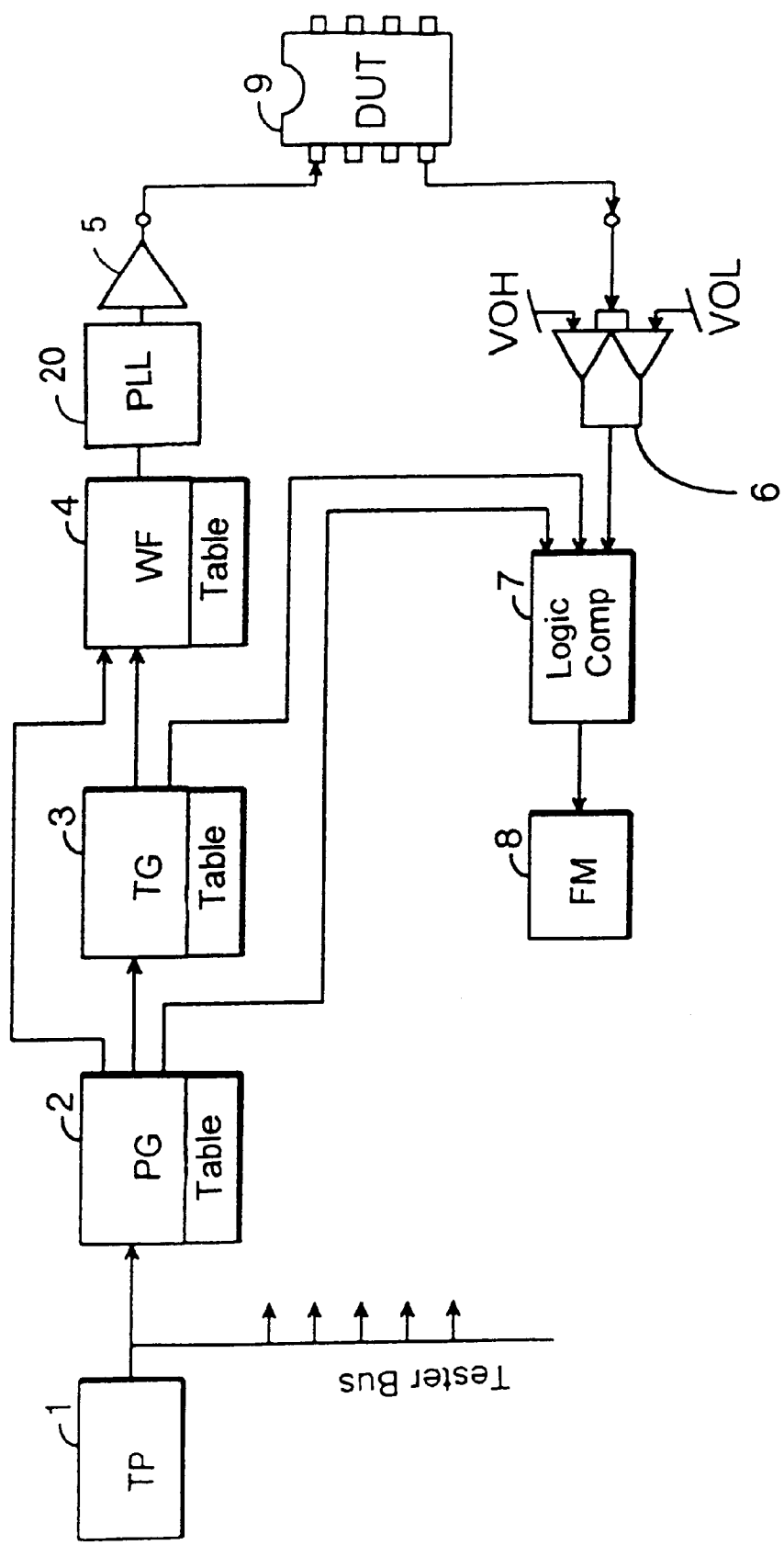
FIG. 7 is a block diagram showing a further embodiment of the present invention wherein a PLL loop is incorporated in a shared resource tester.

The third embodiment of the present invention is shown in block diagram of FIG. 7. In the example of FIG. 7, the present invention is applied to the shared resource tester. A phase lock loop (PLL) 20 is provided between the wave formatter 4 and the driver 5. The PLL 20 increases the frequency of the output signal of the wave formatter 4 as well as reduces the jitter involved in the output of the wave formatter 4 in the manner described in the foregoing.

According to the present invention, the semiconductor test system is able to apply high frequency and low jitter clock signals to an IC device to fully evaluate the performance of the IC device. Further, the semiconductor test system of the present invention is capable of generating a specified number of clock pulses with low jitter to be supplied to an IC device to be tested. The present invention is applicable to both a per-pin type tester and a shared resource type tester.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A semiconductor test system for testing a semiconductor device (DUT) by applying a clock signal to the DUT, comprising:

a clock generator for generating a reference clock signal;

a frame processor for producing a first clock signal of predetermined waveform based on the reference clock signal from the clock generator;

a phase lock loop (PLL) circuit for generating a second clock signal based on the first clock signal from the frame processor, a frequency of the second clock signal generated by the PLL being higher than that of the first clock signal by predetermined times; and a driver for directly receiving the second clock signal from the PLL circuit and applying the second clock signal to the DUT with a predetermined amplitude.

2. A semiconductor test system as defined in claim 1, wherein the PLL circuit is comprised of:

a phase comparator for comparing phases of two input signals and producing an output voltage representing a phase difference between the two input signals where one of the input signals is derived from the first clock signal from the frame processor;

a loop filter for transmitting a low frequency component of the output voltage of the phase comparator in order to regulate a frequency response of the PLL circuit; and a voltage controlled oscillator (VCO) for generating the second clock signal whose oscillation frequency is controlled by the voltage from the loop filter.

3. A semiconductor test system as defined in claim 2, wherein said PLL circuit further includes a counter for reducing the frequency of the first clock signal from the frame processor by a predetermined division ratio, and a pre-scaler for dividing the oscillation frequency of the second clock signal from the VCO by a predetermined division ratio.

4. A semiconductor test system as defined in claim 3, wherein said PLL circuit further includes a programmable counter for dividing the oscillation frequency of the VCO by a variable division ratio, and a latch for receiving division ratio data indicating the variable division ratio and latching the division ratio data to be set in the programmable counter.

5. A semiconductor test system for testing a semiconductor device (DUT) by applying a clock signal to the DUT, comprising:

a clock generator for generating a reference clock signal;

a first frame processor for producing a first clock signal of predetermined waveform based on the reference clock signal from the clock generator;

a phase lock loop (PLL) circuit for generating a second clock signal based on the first clock signal from the first frame processor, a frequency of the second clock signal generated by the PLL being higher than that of the first clock signal by predetermined times;

a second frame processor for producing a gate signal whose time interval represents a specified number of clock pulses of the second clock signal to be applied to the DUT;

an output control circuit for generating the specified number of pulses of the second clock signal from the PLL circuit based on the gate signal from the second frame processor; and a driver for applying the specified number of clock pulses from the output control circuit to the DUT with a predetermined amplitude.

6. A semiconductor test system as defined in claim 5, wherein the PLL circuit is comprised of:

a phase comparator for comparing phases of two input signals and producing an output voltage representing a phase difference between the two input signals where one of the input signals is derived from the first clock signal from the frame processor;

a loop filter for transmitting a low frequency component of the output voltage of the phase comparator in order to regulate a frequency response of the PLL circuit; and a voltage controlled oscillator (VCO) for generating the second clock signal whose oscillation frequency is controlled by the voltage from the loop filter.

7. A semiconductor test system as defined in claim 8, wherein said PLL circuit further includes a counter for reducing the frequency of the first clock signal from the first frame processor by a predetermined division ratio, and a pre-scaler for dividing the oscillation frequency of the second clock signal from the VCO by a predetermined division ratio.

8. A semiconductor test system as defined in claim 7, wherein said PLL circuit further includes a programmable counter for dividing the oscillation frequency of the second clock signal from the VCO by a variable division ratio, and a latch for receiving division ratio data indicating the variable division ratio and latching the division ratio data to be set in the programmable counter.

9. A semiconductor test system for testing a semiconductor device (DUT) by applying a clock signal to the DUT, comprising:

a test processor for controlling an overall operation of the semiconductor test system;

a pattern generator for generating a test pattern signal and an expected value signal based on the instructions from the test processor;

a timing generator for generating timing signals for defining timings in the semiconductor test system;

a wave formatter for producing wave forms of the test pattern signal to be applied to the DUT based on the test pattern from the pattern generator and the timing signal from the timing generator;

a phase lock loop (PLL) circuit for generating a high frequency clock signal based on the wave-formatted test pattern signal from the wave formatter, a frequency of the clock signal generated by the PLL being higher than that of the wave-formatted test pattern signal by predetermined times; and a driver for directly receiving the clock signal from the PLL circuit and applying the clock signal to the DUT with a predetermined amplitude.

10. A semiconductor test system as defined in claim 9, further includes a logic comparator for comparing an output signal from the DUT with the expected value signal from the pattern generator, and a fail memory for storing the information resulted from the comparison in the logic comparator.

11. A semiconductor test system as defined in claim 9, wherein the PLL circuit is comprised of:

a phase comparator for comparing phases of two input signals and producing an output voltage representing a phase difference between the two input signals where one of the input signals is derived from the wave-formatted test pattern signal from the wave formatter;

a loop filter for transmitting a low frequency component of the output voltage of the phase comparator in order to regulate a frequency response of the PLL circuit; and a voltage controlled oscillator (VCO) for generating the clock signal whose oscillation frequency is controlled by the voltage from the loop filter.

12. A semiconductor test system as defined in claim 11, wherein said PLL circuit further includes a counter for reducing the frequency of the test pattern signal from the wave formatter by a predetermined division ratio, and a pre-scaler for dividing the oscillation frequency of the clock signal from the VCO by a predetermined division ratio.

13. A semiconductor test system as defined in claim 12, wherein said PLL circuit further includes a programmable counter for dividing the oscillation frequency of the clock signal from the VCO by a variable division ratio, and a latch for receiving data indicating the variable division ratio and latching the data to be set in the programmable counter.

* * * * *